US008782320B2

(12) United States Patent
Gunnam

(10) Patent No.: US 8,782,320 B2
(45) Date of Patent: Jul. 15, 2014

(54) MULTI-STAGE INTERCONNECTION NETWORKS HAVING FIXED MAPPINGS

(75) Inventor: Kiran Gunnam, San Jose, CA (US)

(73) Assignee: LSI Corporation, San Jose, CA (US)

( * ) Notice: Subject to any disclaimer, the term of this patent is extended or adjusted under 35 U.S.C. 154(b) by 476 days.

(21) Appl. No.: 12/942,344

(22) Filed: Nov. 9, 2010

(65) Prior Publication Data

US 2012/0117295 A1 May 10, 2012

(51) Int. Cl.
*G06F 13/00* (2006.01)
*G06F 7/00* (2006.01)
*G01K 7/00* (2006.01)

(52) U.S. Cl.
USPC .......................................... 710/316; 712/300

(58) Field of Classification Search
USPC ............................. 710/316; 712/300; 374/175
See application file for complete search history.

(56) References Cited

U.S. PATENT DOCUMENTS

| | | | | |
|---|---|---|---|---|
| 3,647,977 A | * | 3/1972 | Closs | 370/434 |
| 5,287,491 A | * | 2/1994 | Hsu | 714/4.1 |
| 5,757,795 A | | 5/1998 | Schnell | |
| 5,768,270 A | * | 6/1998 | Ha-Duong | 370/388 |
| 6,157,643 A | | 12/2000 | Ma | |
| 6,335,930 B1 | * | 1/2002 | Lee | 370/387 |
| 6,456,838 B1 | * | 9/2002 | Wang et al. | 370/380 |
| 7,013,361 B2 | * | 3/2006 | Liron | 710/316 |
| 7,881,568 B2 | * | 2/2011 | Lin | 385/15 |
| 7,911,364 B1 | * | 3/2011 | Zhang et al. | 341/81 |
| 8,065,598 B1 | * | 11/2011 | Gunnam et al. | 714/800 |
| 8,099,561 B2 | * | 1/2012 | Bayer et al. | 711/150 |
| 8,161,345 B2 | * | 4/2012 | Graef | 714/752 |
| 8,170,129 B2 | | 5/2012 | Chang et al. | |
| 8,265,070 B2 | * | 9/2012 | Khanduri | 370/387 |
| 8,279,867 B2 | * | 10/2012 | Carley | 370/390 |
| 2001/0007608 A1 | | 7/2001 | Sugita et al. | |
| 2002/0108030 A1 | * | 8/2002 | Lee et al. | 712/300 |
| 2002/0174434 A1 | * | 11/2002 | Lee et al. | 725/74 |
| 2003/0112797 A1 | | 6/2003 | Li et al. | |
| 2005/0015234 A1 | | 1/2005 | Bhattacharya et al. | |
| 2006/0179401 A1 | | 8/2006 | Nefedov | |
| 2006/0282712 A1 | | 12/2006 | Argon et al. | |

(Continued)

OTHER PUBLICATIONS

Jiri Jaros, Evolutionay Optimization of Multistage Interconnection Networks Performance, Jul. 8, 2009, GECCO 09.*

(Continued)

*Primary Examiner* — Paul R Myers
*Assistant Examiner* — Christopher A Daley
(74) *Attorney, Agent, or Firm* — Mendelsohn, Drucker & Dunleavy, P.C.; Craig M. Brown; Steve Mendelsohn

(57) ABSTRACT

In one embodiment, a multistage interconnection network (MIN) has two or more configurable stages, each stage having a plurality of switches. The network has one or more unused input terminals, each mapped using fixed switch connections to an unused output terminal. The network also has a set of used input terminals that are selectively mapped to a set of used output terminals based on values of control signals supplied to the stages. Each stage receives a different control signal, and each control signal is generated by cyclically shifting a control seed by a corresponding cyclic-shift value. Fixing the mappings of the unused terminals ensures that the used input terminals are not mapped to any unused output terminals. By storing only the control seed, memory requirements are reduced over networks that explicitly store individual control signals for all of the stages.

20 Claims, 5 Drawing Sheets

(56) References Cited

U.S. PATENT DOCUMENTS

| | | | |
|---|---|---|---|
| 2007/0011569 A1* | 1/2007 | Vila Casado et al. | 714/758 |
| 2007/0208988 A1 | 9/2007 | Aman et al. | |
| 2008/0028272 A1 | 1/2008 | Richardson | |
| 2008/0056202 A1 | 3/2008 | Kim et al. | |
| 2008/0107103 A1* | 5/2008 | Yang et al. | 370/388 |
| 2008/0301536 A1* | 12/2008 | Shin et al. | 714/786 |
| 2008/0320353 A1 | 12/2008 | Blankenship et al. | |
| 2009/0024909 A1 | 1/2009 | Shen et al. | |
| 2009/0077447 A1* | 3/2009 | Buckley et al. | 714/757 |
| 2009/0083606 A1 | 3/2009 | Choi et al. | |
| 2009/0180535 A1 | 7/2009 | Bretl et al. | |
| 2009/0224801 A1* | 9/2009 | Lewin | 326/52 |
| 2010/0111014 A1 | 5/2010 | Kang et al. | |
| 2010/0118800 A1 | 5/2010 | Kim et al. | |
| 2010/0169738 A1 | 7/2010 | Wu et al. | |
| 2010/0189162 A1 | 7/2010 | Yoshimoto et al. | |
| 2010/0214857 A1 | 8/2010 | Hsu et al. | |
| 2011/0093762 A1 | 4/2011 | Kwon et al. | |
| 2012/0079340 A1 | 3/2012 | Gunnam et al. | |
| 2012/0176856 A1 | 7/2012 | Hsu et al. | |

OTHER PUBLICATIONS

Chrisatian Schack et al, A Multiprocessor Architecture with an Omega Netowrk for the Massively Parallel Model GCA, 2009, Springer-Verlag.*

K. Gunnam et al., "Value-Reuse Properties of Min-Sum for GF(q)" (dated Oct. 2006) Dept. of ECE, Texas A&M University Technical Note, published about Aug. 2010.

K. Gunnam et al., "Value-Reuse Properties of Min-Sum for GF (q)" (dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

Gunnam, Kiran K. et al., "VLSI Architectures for Layered Decoding forIrregular LDPC Codes of WiMax," IEEE Communications Society, ICC 2007 Proceedings, pp. 4542-4547.

Gunnam, Kiran K. et al., "Technical Note on Iterative LDPC Solutions for Turbo Equalization," Department of ECE, Texas A&M University, College Station, TX-77843, Jul. 2006, pp. 1-5.

Al-Qerem, Ahmad H. "Congestion Control by Using a Bufferred Omega Network," IADIS International Conference on Applied Computing 2005, pp. 429-434.

Mahajan, Rita and Vig, Dr. Renu,"Performance and Reliability Analysis of New Fault-Tolerant Advance Omega Network," WSEAS Transactions on Computers, Issue 8, vol. 7, Aug. 2008, pp. 1280-1290.

Aljundi, Ahmad Chadi et al., "A Study of an Evaluation Methodology for Unbuffered Multistage Interconnection Networks,"IPDPS '03 Proceedings of the 17th International Symposium on Parallel and Distributed Processing, 2003, pp. 1-8.

* cited by examiner

MULTI-STAGE INTERCONNECTION NETWORKS HAVING FIXED MAPPINGS

CROSS-REFERENCE TO RELATED APPLICATIONS

The subject matter of this application is related to:
U.S. patent application Ser. No. 12/644,314 filed on Dec. 22, 2009,
U.S. patent application Ser. No. 12/835,989 filed on Jul. 14, 2010,
U.S. patent application Ser. No. 12/891,161 filed on Sep. 27, 2010, and
U.S. patent application Ser. No. 12/910,993 filed on Oct. 25, 2010,
the teachings of all of which are incorporated herein by reference in their entirety.

BACKGROUND OF THE INVENTION

1. Field of the Invention

The present invention relates to signal processing, and, more specifically but not exclusively, to techniques for interleaving and de-interleaving.

2. Description of the Related Art

A multistage interconnection network (MIN) is a network constructed of a plurality of stages interconnected by wires or optical fibers, where each stage is constructed using one or more switching elements. Generally, a multistage interconnection network is defined by the number N of inputs to the network and the number M of outputs. For instance, an (N×M) multistage interconnection network is used for the interconnection of a set of N input terminals to a set of M output terminals. When the number N of input terminals of a multistage interconnection network is equal to the number M of output terminals, the multistage interconnection network may be designated as an (N×N) multistage interconnection network, having a size N. Currently, there are many different multistage interconnection networks known in the art such as Banyan networks, Clos networks, Belles networks, Delta networks, and Omega networks.

FIG. 1 shows a simplified block diagram of one implementation of a prior-art multistage interconnection network 100 known as an Omega network. In general, Omega networks are (N×N) multistage interconnection networks that are sized according to integer powers of two. Thus, Omega networks have sizes of N=2, 4, 8, 16, 32, 64, 128, etc. Further, the number L of stages in an Omega network is equal to $\log_2(N)$ and the number of (2×2) switches per stage is equal to N/2.

Omega network 100 is an (8×8) network that receives eight input values at eight input terminals A[0:7] and maps the eight input values to eight output terminals B[0:7]. Each input value may be any suitable value such as a single bit, a plurality of bits, a sample, or a soft value (such as a Viterbi log-likelihood ratio (LLR) value) having a hard-decision bit and at least one confidence-value bit. The eight input values are mapped to the eight output terminals using $\log_2(8)=3$ configurable stages i, where i=1, 2, 3, each of which comprises 8/2=4 (2×2) switches.

Each stage i receives the eight input values from the previous stage, or from input terminals A[0:7] in the case of stage 1, via a fixed interconnection system (e.g., 102, 104, and 106) that implements a perfect shuffle on the eight input values. A perfect shuffle is a process equivalent to (i) dividing a deck of cards into two equal piles, and (ii) shuffling the two equal piles together in alternating fashion such that the cards in the first pile alternate with the cards from the second pile.

For example, stage 1 receives eight inputs values from input terminals A[0:7] via fixed interconnection system 102. Fixed interconnection system 102 performs a perfect shuffle on the eight input values by dividing the eight input values received at input terminals A[0:7] into a first set corresponding to input terminals A[0:3] and a second set corresponding to input terminals A[4:7]. The two sets are provided to stage 1 in alternating fashion such that the input values at input terminals A[0] and A[4] are provided to the upper and lower inputs of switch 108(0), respectively; the input values at input terminals A[1] and A[5] are provided to the upper and lower inputs of switch 108(1), respectively; the input values at input terminals A[2] and A[6] are provided to the upper and lower inputs of switch 108(2), respectively; and the input values at input terminals A[3] and A[7] are provided to the upper and lower inputs of switch 108(3), respectively. Similarly, fixed interconnection system 104 performs a perfect shuffle on the outputs of switches 108(0), 108(1), 108(2), and 108(3) and provides the shuffled outputs to switches 110(0), 110(1), 110(2), and 110(3) of stage 2, and fixed interconnection system 106 performs a perfect shuffle on the outputs of switches 110(0), 110(1), 110(2), and 110(3) and provides the shuffled outputs to switches 112(0), 112(1), 112(2), and 112(3) of stage 3.

In addition to receiving eight input values, each configurable stage i receives a four-bit control signal Ci[0:3] from control signal memory (e.g., ROM) 114, wherein each bit of the four-bit control signal configures a different one of the four 2×2 switches in the stage. Thus, switches 108(0), 108(1), 108(2), and 108(3) are configured based on the values of control bits C1[0], C1[1], C1[2], and C1[3], respectively, switches 110(0), 110(1), 110(2), and 110(3) are configured based on the values of control bits C2[0], C2[1], C2[2], and C2[3], respectively, and switches 112(0), 112(1), 112(2), and 112(3) are configured based on the values of control bits C3[0], C3[1], C3[2], and C3[3], respectively.

Setting a control bit to a value of one configures the corresponding switch as a crossed connection such that (i) the value received at the upper input is provided to the lower output and (ii) the value received at the lower input is provided to the upper output. Setting a control bit to a value of zero configures the corresponding switch as a straight pass-through connection such that (i) the value received at the upper input is provided to the upper output and (ii) the value received at the lower input is provided to the lower output.

In signal-processing applications, multistage interconnection networks, such as Omega network 100, are often used for routing purposes to connect processors on one end of the network to memory elements on the other end. However, multistage interconnection networks may also be used in signal-processing applications for other purposes, such as for permutating or interleaving a contiguous data stream.

Interleaving is used in many signal-processing systems to re-arrange a contiguous data stream in a non-contiguous manner. Often, interleaving is used to reduce the effects that burst errors in a transmission channel have on recovering data at a receiver. For example, in conventional hard-disk drive (HDD) systems, contiguous bits of a data stream may be interleaved before writing the data stream to a hard-disk platter. Upon retrieving the interleaved data stream, burst errors, which result in a plurality of consecutive interleaved bits of the data stream being in error, may occur. The read channel of the HDD system de-interleaves the bits of the interleaved data stream such that the errors are spread amongst the data stream. Spreading the errors increases the likelihood that an error-correction encoder can correct any errors present in the data stream.

Multistage interconnection networks are particularly useful in implementing local interleavers in local/global interleavers and local de-interleavers in local/global de-interleavers. Local/global interleavers, which are discussed in U.S. patent application Ser. No. 12/891,161 and U.S. patent application Ser. No. 12/835,989, perform both local interleaving on a local unit basis and global interleaving on a global unit basis, where (i) the unit basis refers to the number of values treated as a fixed unit for interleaving purposes and (ii) the global unit basis is larger than the local unit basis.

For example, in one implementation, a local/global interleaver has a local interleaver that receives sets of 96 values. The local interleaver interleaves the 96 in values in each set on a local unit basis, where the local unit basis (i.e., the number of values treated as a fixed local unit for local de-interleaving) is one value. Thus, the local interleaver interleaves 96 local units (i.e., 96 values) at the level of the individual value (i.e., value by value) to generate a set of 96 interleaved values.

After interleaving each set of 96 values, the local interleaver outputs one or more global units to a global interleaver. A global unit may be greater than the local set size (e.g., 96 values), equal to the local set size, or smaller than the local set size. For example, for each set of 96 values, the local interleaver may output one global unit having the 96 values or the local interleaver may output four global units in parallel, each having only 24 of the 96 values. The global interleaver then interleaves the global units at the level of the global unit (i.e., global unit by global unit) to generate interleaved global units. For example, the global interleaver may interleave multiple global units, where each global unit is itself either (i) a set of 96 interleaved values or (ii) a set of 24 interleaved values.

When implementing a multistage interconnection network, such as an Omega network, in a local/global interleaver or de-interleaver, the multistage interconnection network size should be selected appropriately for the number of inputs and the number of outputs to be interconnected. However, the number of inputs and the number of outputs to be interconnected might not correspond to a multistage interconnection network size. In such cases, a multistage interconnection network size may need to be selected that is capable of processing greater numbers of inputs and outputs than is actually needed for the particular signal-processing system. As a result, a number of input terminals and output terminals of the multistage interconnection network might not be used.

For example, suppose that an Omega network is used to implement a local interleaver in a local/global interleaver that interleaves 96 values. Since Omega networks are sized according to integer powers of two, there is no Omega network size corresponding to 96 inputs and 96 outputs. A (64×64) Omega network does not have enough input terminals to process all 96 values in a set at one time, and the smallest Omega network that can process 96 values at one time is a (128×128) Omega network. Using a (128×128) Omega network to process 96 values results in 32 input terminals and 32 output terminals of the Omega network being unused.

In performing an interleaving operation, the Omega network used to implement the local interleaver may output the 96 input values to any of the 128 output terminals depending on the configuration of the Omega network stages. Further, since different interleaving mappings may be used from one interleaving operation to the next, the locations of the used and unused output terminals may vary from one interleaving operation to the next. This variability may make it difficult to determine which output terminals of the Omega network should be provided to the global interleaver for global interleaving. Further, when the Omega network outputs multiple global units at a time (e.g., four 24-value global units for each set of 96 values output by the Omega network), this variability may make it difficult to ascertain the output terminals that correspond to each of the multiple global units. Thus, there is a need to (i) develop a method for ascertaining the locations of the used output terminals and route the used connections properly to the global interleaver or (ii) develop multistage interconnection networks in which the locations of the used output terminals and unused output terminals are fixed such that they do not vary from one interleaving operation to the next.

Referring again to (8×8) Omega network 100 of FIG. 1, for each interleaving mapping (i.e., particular routing of the eight inputs to the eight outputs), Omega network 100 stores twelve total control bits (i.e., one four-bit control signal for each of the three different stages). In some interleaving applications, the Omega network implements many different mappings. For example, suppose that Omega network 100 implements six different mappings. In such a case, control signal memory 114 stores six mappings×12 bits/mapping=72 total bits.

The number of control bits stored can be even greater for larger Omega networks. For example, suppose that a (128×128) Omega network is used to implement a local interleaver in the local/global interleaver described above. A (128×128) Omega network has $\log_2(128)=7$ stages, where each stage has 128/2=64 switches. The 7×64=448 total switches are configured based on 448 control bits for each interleaving mapping. Suppose also that the Omega network performs twelve different interleaving mappings. In this case, the control signal ROM stores 12×448=5,376 bits for the twelve different interleaving mappings.

It is preferable that the number of bits stored by the control signal ROM be reduced such that the size of the control signal ROM may be reduced. However, each of the bits stored by the control signal ROM is needed to configure a different switch in the Omega network. Simply reducing the number of control bits would result in one or more switches not receiving a control bit. Thus, there is a need to reduce the number of control signal bits that are stored by the control signal ROM, and yet still be able to provide a control bit to each of the switches in the Omega network.

SUMMARY OF THE INVENTION

In one embodiment, the present invention is an apparatus comprising a configurable (N×N) multistage interconnection network having N input terminals connected to N output terminals by a plurality of stages, each stage having a plurality of switches. The multistage interconnection network comprises a plurality of fixed switches and a plurality of configurable switches, such that (i) J of the N input terminals of the multistage interconnection network are fixedly connected to J of the N output terminals through the plurality of fixed switches, and (ii) the remaining (N−J) input terminals are configurably connectable to the remaining (N−J) output terminals by configuring the plurality of configurable switches.

In another embodiment, the present invention is a method for making a configurable (N×N) multistage interconnection network having N input terminals connected to N output terminals by a plurality of stages, each stage having a plurality of switches. The method comprises (a) selecting J of the N input terminals to be unused input terminals, and (b) fixing a subset of the plurality of switches to fixedly connect the J unused input terminals to J unused output terminals. Steps (a) and (b) are performed such that (i) the plurality of switches comprises the subset of fixed switches and a subset of configurable switches, and (ii) the remaining (N−J) input terminals are configurably connectable to the remaining (N−J) output terminals by configuring the subset of configurable switches.

In yet another embodiment, the present invention is a method for operating a configurable (N×N) multistage interconnection network having N input terminals connected to N output terminals by a plurality of stages, each stage having a plurality of switches. The multistage interconnection network comprises a plurality of fixed switches and a plurality of configurable switches, such that (i) J of the N input terminals are fixedly connected to J of the N output terminals through the plurality of fixed switches, and (ii) the remaining (N−J) input terminals are configurably connectable to the remaining (N−J) output terminals by configuring the plurality of configurable switches. The method comprises (a) configuring the plurality of configurable switches to connect the remaining (N−J) input terminals to the remaining (N−J) output terminals, and (b) routing (N−J) input values applied to the remaining (N−J) input terminals to the remaining (N−J) output terminals.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Multistage Interconnection Networks Having Fixed Mappings

According to various embodiments, multistage interconnection networks are envisioned having one or more unused input terminals, an equal number of unused output terminals, a set of used input terminals, and a set of used output terminals. Each of the one or more unused input terminals is mapped using fixed connections to an unused output terminal, such that the mapping for those unused input and output terminals does not change. Further, the set of used input terminals is selectively mapped to the set of used output terminals. Fixing the mappings to the unused output terminals ensures that the used input terminals may not be mapped to any of the unused output terminals.

Figure 1:
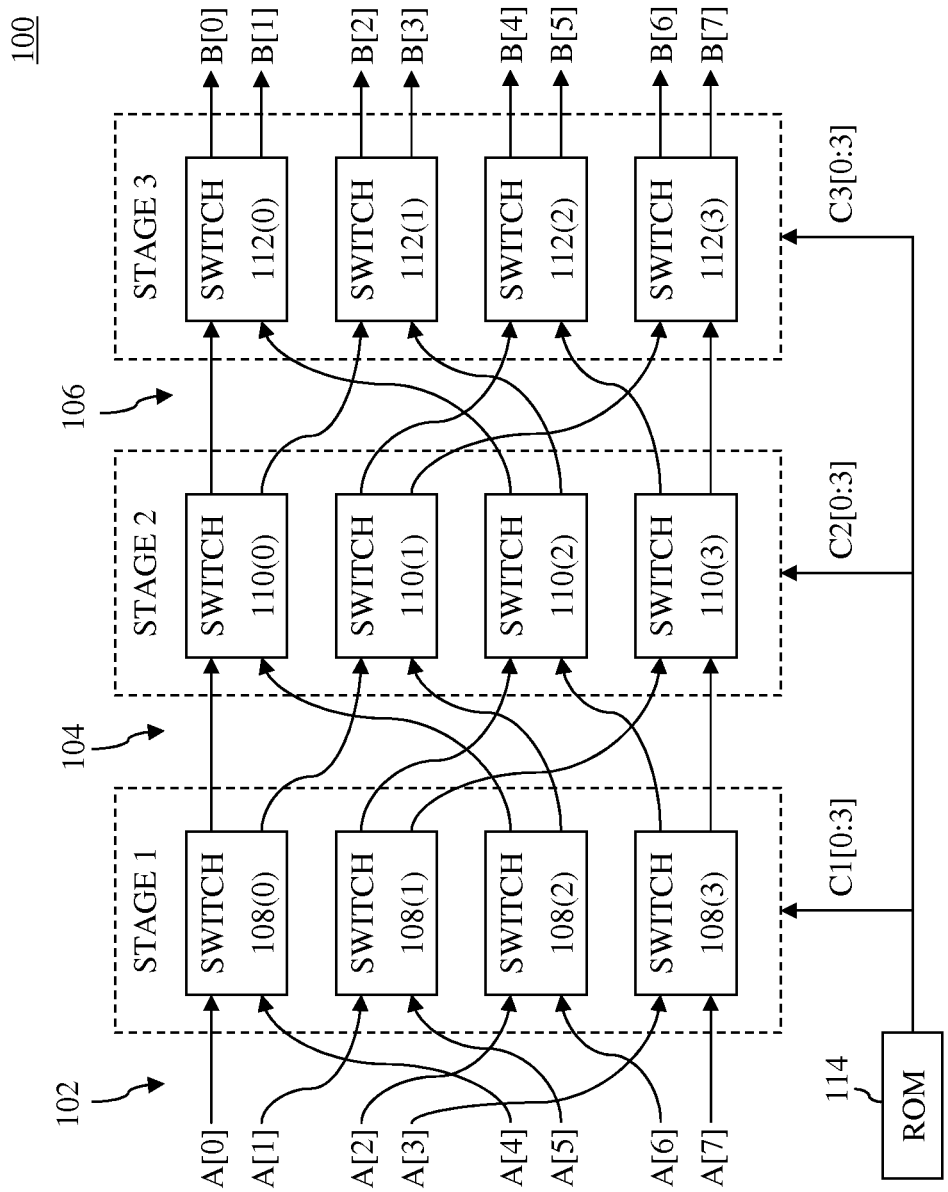
FIG. 1 shows a simplified block diagram of one implementation of a prior-art multistage interconnection network known as an Omega network.
Figure 2:
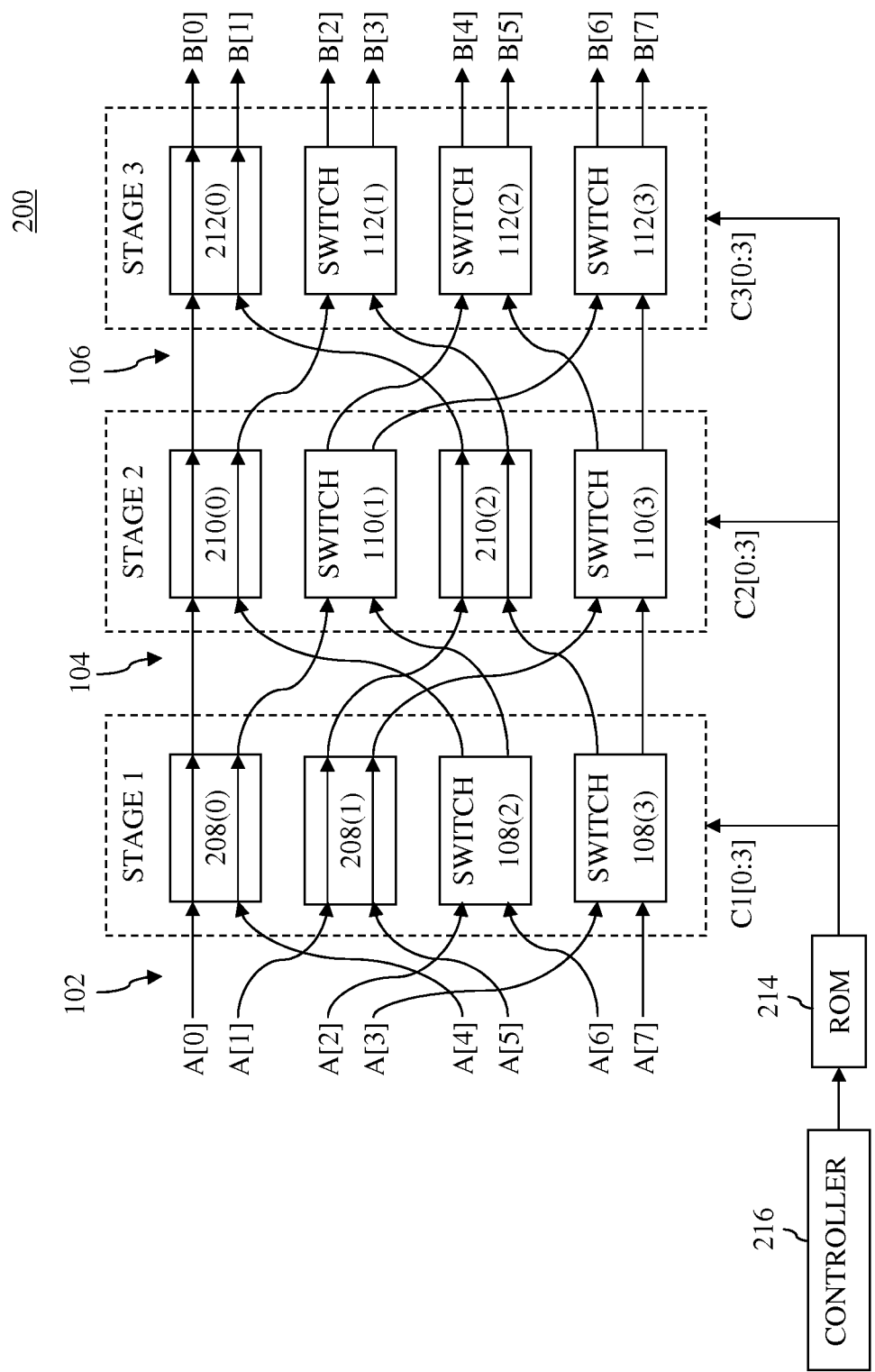
FIG. 2 shows a simplified block diagram of one embodiment of a modified (8×8) Omega network.

FIG. 2 shows a simplified block diagram of one embodiment of a modified (8×8) Omega network 200. Similar to Omega network 100 of FIG. 1, Omega network 200 has eight input terminals and eight output terminals. However, as discussed below, unlike Omega network 100 in which all eight input terminals may be mapped variously to the eight output terminals, two of the input terminals of Omega network 200 are mapped to two fixed output terminals. Thus, only six input terminals of Omega network 200 may be mapped variously to six output terminals.

Omega network 200 has fixed interconnection systems 102, 104, and 106, which operate in a manner similar to the analogous components of Omega network 100 of FIG. 1. Further, similar to Omega network 100, Omega network 200 has three configurable stages i, where i=1, 2, 3. However, rather than having four configurable switches, each stage i of Omega network 200 has a combination of one or more configurable switches and one or more fixed switches. For example, stage 1 has configurable switches 108(2) and 108(3), which operate in the same manner as the like numbered switches in FIG. 1, and fixed switches 208(0) and 208(1). Stage 2 has configurable switches 110(1) and 110(3), which operate in the same manner as the like numbered switches in FIG. 1, and fixed switches 210(0) and 210(2). Stage 3 has configurable switches 112(1), 112(2), and 112(3), which operate in the same manner as the like numbered switches in FIG. 1, and fixed switch 212(0). Note that each fixed switch in FIG. 2 is represented by showing the fixed connection paths of the switch. For example, the upper input of switch 208(0) is shown as being connected to the upper output, and the lower input of switch 208(0) is shown as being connected to the lower output. To further understand how the locations and configurations of the fixed switches are selected, consider FIG. 3.

Figure 3:
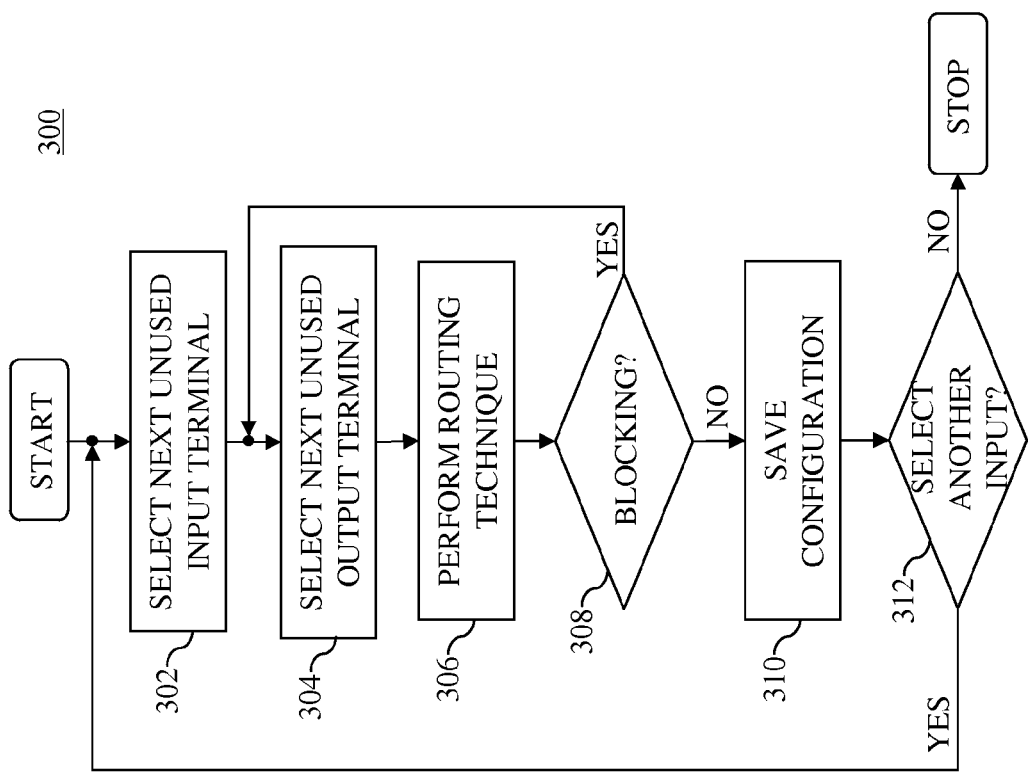
FIG. 3 shows a simplified flow diagram of exemplary off-line processing that may be used select the locations and configurations of the fixed switches in FIG. 2.

FIG. 3 shows a simplified flow diagram of exemplary off-line processing that may be used select the locations and configurations of the fixed switches in FIG. 2. At the start of the processing, the designer of multistage interconnection network selects (i) a first input terminal (step 302) that will not be used for interleaving and (ii) a first output terminal (step 304) to which the selected input terminal is to be mapped. Selection of the first unused input terminal and the first unused output terminal may be made based on the designer's preference. For example, the designer might prefer that all of the unused input terminals in the network be located together. Alternatively, the unused inputs in the network may be interspersed with input terminals that are used for interleaving.

After the first unused input terminal and the first unused output terminal are selected, a routing technique (step 306) is performed to identify (i) the switches that are to be fixed (i.e., one switch per stage) and (ii) the configurations of those fixed switches (i.e., crossed connection or straight pass-through connection) to connect the first unused input terminal to the first unused output terminal. The routing technique used may be destination-tag routing, XOR-tag routing, or any suitable routing technique. The particular routing technique used may vary depending on the type of multistage interconnection network that is being utilized.

As an example of XOR-tag routing, suppose that, in steps 302 and 304, input terminal A[0] in FIG. 2 and output terminal B[0] are selected, respectively. Input terminals A[0] to A[7] are each assigned a different three-bit value. Input terminal A[0] is assigned a value of [000], and the three-bit values are increased by one for each subsequent input terminal until input terminal A[7], which is assigned a value of [111]. Similarly, output terminals B[0] to B[7] are assigned three-bit values [000] to [111], respectively.

An XOR operation is applied to the assigned values corresponding to the selected input terminal and the selected output terminal. Thus, in the above example, an XOR operation is applied to a value of [000], which corresponds to input terminal A[0], and another value of [000], which corresponds to output terminal B[0]. The result of the XOR operation is an XOR tag, which, in this example, has a value of [000].

The most-significant bit of the XOR tag is used to configure the appropriate switch in the first stage. If the most-significant bit has a value of zero, then the switch is configured as a straight pass-through connection. If the most-significant bit has a value of one, then the switch is configured as a crossed connection. Similarly, the next-most-significant bit of the XOR tag is used to set the appropriate switch in the next stage, and the least-significant bit of the XOR tag is used to set the appropriate switch in the last stage.

In this example, input terminal A[0] is connected to the upper input of switch 208(0). Thus, the first bit of the XOR tag (i.e., 0) indicates that switch 208(0) should be configured as a straight pass-through connection in order to map input terminal A[0] to output terminal B[0]. The next switch location is determined by considering the output of now-configured switch 208(0). The upper input of switch 208(0) is connected to switch 210(0). Thus, the second bit of the XOR tag (i.e., 0) indicates that switch 210(0) should be configured as a straight pass-through connection in order to map input terminal A[0] to output terminal B[0]. The final switch location is determined by considering the output of now-configured switch 210(0). The upper input of switch 210(0) is connected to switch 212(0). Thus, the third bit of the XOR tag (i.e., 0) indicates that switch 212(0) should be configured as a straight pass-through connection in order to map input terminal A[0] to output terminal B[0].

Note that, although the fixed switches in the embodiment of FIG. 2 are all configured as straight pass-through connections, in alternative embodiments, one or more of the fixed switches may be configured as crossed connections. In addition, the number of fixed switches per stage may vary from one embodiment to the next, depending on the number and locations of unused input and unused output terminals.

After identifying the fixed switches and their configurations for the first selected input and output terminals, a determination (decision 308) is made as to whether the mapping of the selected input terminal to the selected output terminal results in a blocking condition. In general, a blocking condition exists when one mapping requires a switch in the network to be configured as a straight pass-through connection, while another mapping requires the same switch to be configured as a crossed connection. Note that, when routing the first selected input terminal to the first selected output terminal, a blocking condition will not exist because none of the switches have been previously configured by this point. However, when routing subsequently selected input terminals to subsequently selected output terminals, the subsequently determined routings may be in conflict with previously determined routings.

If a blocking condition exists, then the unused output terminal selected in step 304 cannot be connected to the unused input terminal selected in step 302 and processing returns to step 304 to select a different unused output terminal. If a blocking condition does not exist, then the switch configurations are saved (step 310), and a determination (decision 312) is made as to whether there is another unused input terminal to be connected to an unused output terminal. This determination may be made by, for example, comparing the number of input terminals already considered in flow diagram 300 to the total number of desired unused input terminals selected by the designer. For example, Omega network 200 of FIG. 2 is designed to have a total of two unused input terminals. If the number of unused input terminals considered is less than two, then processing returns to step 302, and steps 302 to 312 are repeated for the next unused input terminal. If the number of unused input terminals considered is equal to two, then processing stops.

Returning to FIG. 2, after the locations and configurations of the fixed switches are determined, the multistage interconnection network is implemented having those determined fixed switch locations and configurations. Each fixed switch may be fixed using any of a number of different suitable methods. According to one such method, control bits, received from memory 214, that correspond to the fixed switches may be masked by, for example, passing the control bits through logical gates (not shown) to generate fixed control bits. Each fixed control bit has the same value regardless of the value of the original control bit. For example, suppose that control bit C1[0] is provided to one input of a logical AND gate (not shown) and a value of zero is provided to the other input of the logical AND gate. Regardless of the value of control bit C1[0], the logical AND gate generates a fixed control bit C1'[0] that always has a value of zero. Since the fixed control bit C1'[0], which is provided to switch 208(0), does not change, the configuration of switch 208(0) does not change. Note that, other logical gates may be used to generate a fixed control bit that always has a value of one.

The use of masking makes it possible to fix different numbers of input and output terminals from one interleaving operation to the next. For example, suppose that every switch in Omega network 200 corresponds to an AND gate. In some interleaving operations, a value of zero may be provided to each of the AND gates corresponding to switches 208(0), 208(1), 210(0), 210(2), and 212(0), and a value of one may be provided to the AND gates corresponding to all other switches. As a result, switches 208(0), 208(1), 210(0), 210(2), and 212(0) are fixed, and two unused input terminals A[0] and A[1] are mapped to two unused output terminals B[0] and B[1]. In other interleaving operations, a value of zero may be provided to each of the AND gates corresponding to switches 208(0), 210(0), and 212(0), and a value of one may be provided to the AND gates corresponding to all other switches. As a result, only switches 208(0), 210(0), and 212(0) are fixed, and only one unused input terminal A[0] is mapped to one unused output terminal B[0].

According to another method for fixing switches, the control port of each fixed switch may be hardwired to ground to fix the control signal to zero or hardwired to VDD to fix the control signal to one. According to yet another method, the connections within each fixed switch themselves may be hardwired such that the switch configuration cannot be changed. In both of these methods, the control bits received from memory 214 corresponding to the fixed switches are not used to configure the corresponding fixed switches, and thus, control bits corresponding to the fixed switches need not be saved.

Control signal memory 214, which may be implemented using ROM or any other suitable type of memory, stores one or more sets of control signals, where each set has one control signal for each stage i of the network (e.g., each set has three control signals Ci[0:3]). Each control signal may comprise four bits or, in embodiments in which the fixed switches do not use the control signal bits, some of the control signals may comprise fewer than four bits. For example, if the control ports of switches 208(0) and 208(1) are wired to ground, then control signal C1 need only comprise two bits for switches 208(2) and 208(3).

Each set of control signals corresponds to a different interleaving mapping that can be performed by Omega network 200. The three control signals in each set may be generated randomly by off-line processing and subsequently stored in control signal memory 214. When generating each set of control signals, an analysis of the mapping that results from the randomly generated control signals may be performed to determine whether the resulting mapping adequately spreads values that are input to Omega network 200. Adequacy of the spreading may depend, for example, on the ability of the error-correction encoder that is used to correct errors. For example, error-correction encoders that are capable of correcting longer strings of contiguous errors might require less spreading than error-correction encoders that are capable of correcting only shorter strings of contiguous errors.

In operation, six input values are provided to used input terminals A[2] to A[7], and no input values are provided to unused input terminals A[0] and A[1]. The input values provided to input terminals A[2] to A[7] are mapped variously to output terminals B[2] to B[7] based on (i) the set of control signals provided by control signal memory 214 and (ii) the routing of the fixed switches. The particular set of control signals provided by control signal memory 214 for each interleaving operation may vary from one interleaving operation to the next. For each interleaving operation, controller 216 selects a set of control signals, and instructs control signal memory 214 to output that set of control signals.

When Omega network 200 implements a local interleaver in a local/global interleaver as discussed above, a different set of control signals, and hence a different interleaving mapping, may be used for each subsequent interleaving operation performed. For example, suppose that a (128×128) Omega network analogous to Omega network 200 is used to interleave the values in a 5,184-value codeword, 96 values at a time. In such a case, the Omega network may implement 5,184/96=54 different interleaving mappings, one for each different set of 96 codeword values.

Upon receiving a set of control signals, each configurable switch in a stage is configured based on one of the four bits of the corresponding control signal as discussed above in relation to FIG. 1. For example, switches 108(2) and 108(3) are configured based on the values of control bits C1[2] and C1[3], respectively, switches 110(1) and 110(3) are configured based on the values of control bits C2[1] and C2[3], respectively, and switches 112(1), 112(2), and 112(3) are configured based on the values of control bits C3[1], C3[2], and C3[3], respectively.

Multistage Interconnection Networks Having Smaller Memory Requirements

In accordance with various embodiments of the present invention, a multistage interconnection network is envisioned that has control-signal memory for storing a number of control bits that is less than the number of switches in the network. Preferably, the control-signal memory stores a control seed value having a number of control bits that is equal to the number of switches in one stage of the multistage interconnection network. The control seed value is then permutated to generate the control signals for one or more stages of the multistage interconnection network.

Figure 4:
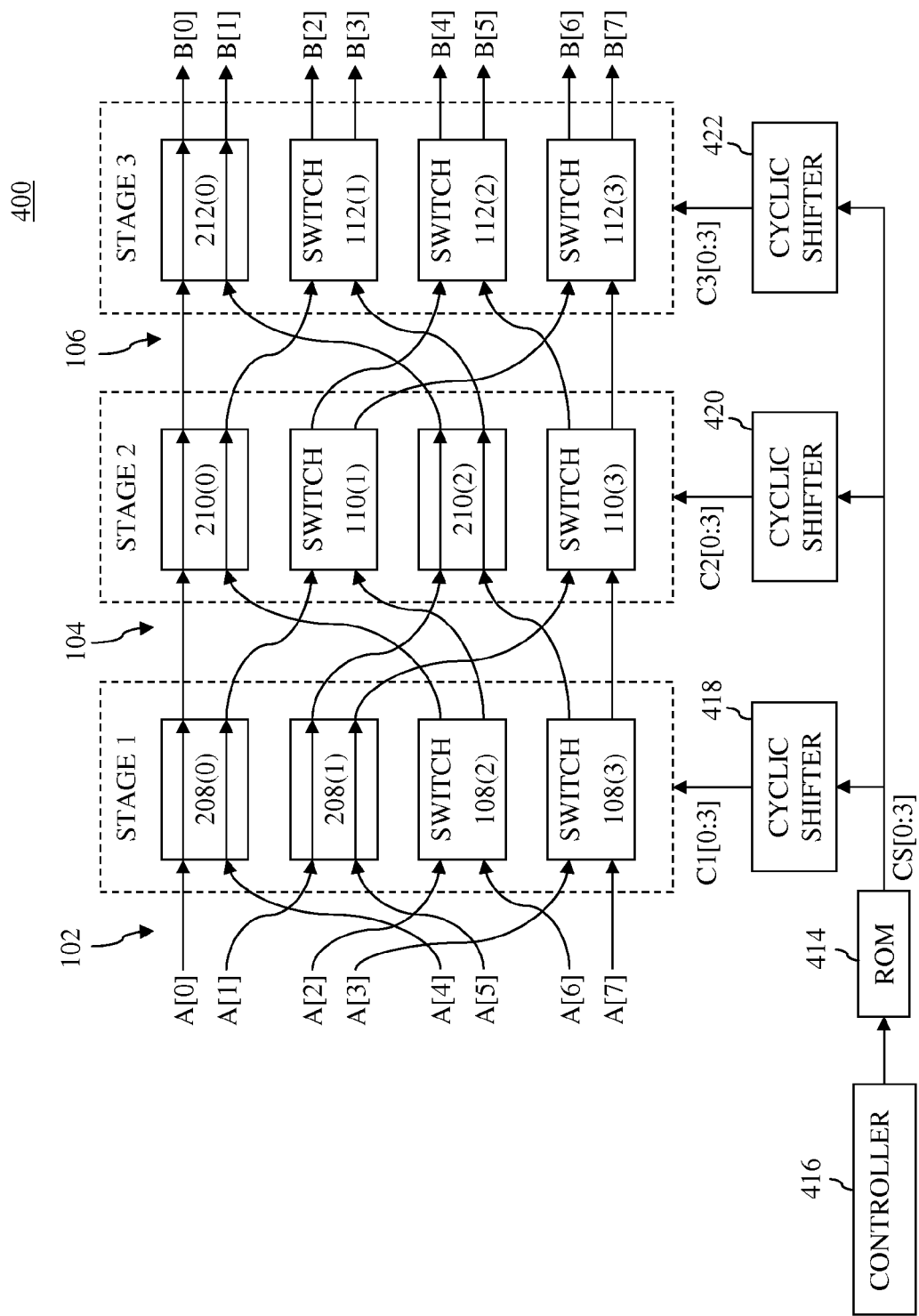
FIG. 4 shows a simplified block diagram of a modified (8×8) Omega network according to one embodiment of the present invention.

FIG. 4 shows a simplified block diagram of a modified Omega network 400 according to one embodiment of the present invention. Omega network 400 has stages 1, 2, and 3, and fixed interconnection systems 102, 104, and 106, which are the same as the analogous components in Omega network 200. In addition, Omega network 400 has control-seed memory 414 and cyclic shifters 418, 420, and 422. Control-seed memory 414, which stores a different four-bit control seed value CS[0:3] for each different interleaving mapping employed, may be implemented using ROM or any other suitable type of memory.

In operation, for each interleaving operation performed, controller 416 instructs control-seed memory 414 to provide a four-bit control-seed value CS[0:3] to cyclic shifters 418, 420, and 422. The particular control-seed value provided may vary from one interleaving operation to the next. Each cyclic shifter, which may be implemented using any suitable cyclic shifter, such as a barrel shifter or fixed connections that perform a cyclic shift, shifts the control-seed value CS[0:3] to generate a control signal Ci[0:3]. Control signal Ci[0:3] is then used to configure the configurable switches of the corresponding stage i.

Each cyclic shifter shifts control-seed value CS[0:3] by a cyclic-shift value Cyclic_Shift_i calculated as shown in Equation (1) below:

$$\text{Cyclic\_Shift\_}i = j \times \text{ceil}(N/(2 \times L)) + j, \quad (1)$$

where i is the stage number, N is the size of the Omega network, j=L−i+1, L is the number of stages in the Omega network, and the ceiling function ceil(x) rounds x to the nearest integer greater than or equal to x. For example, cyclic shifter 418 shifts the control seed value by a value of (3−1+1)×ceil(8/(2×3))+(3−1+1)=9, cyclic shifter 420 shifts the control seed by a value of (3−2+1)×ceil(8/(2×3))+(3−2+1)=6, and cyclic shifter 422 shifts the control seed by a value of (3−3+1)×ceil(8/(2×3))+(3−3+1)=3.

Each four-bit control seed value may be generated randomly off-line and stored in control-seed memory 414. When generating each control-seed value, an analysis of the mapping that results from cyclically shifting the randomly generated control-seed value may be performed to determine whether the resulting mapping adequately spreads values that are input to Omega network 200. Similar to generating the control signals in FIG. 2, adequacy of the spreading may depend, for example, on the ability of the error-correction encoder that is used to correct errors.

Upon configuring the configurable switches, six input values are provided to used input terminals A[2] to A[7], and no input values are provided to unused input terminals A[0] and A[1]. The input values provided to input terminals A[2] to A[7] are then mapped variously to output terminals B[2] to B[7] based on (i) the values of the control signals provided by cyclic shifters 418, 420, and 422, and (ii) the routing of the fixed switches.

Compared to Omega networks 100 and 200, Omega network 400 requires less memory for storing the control signals used by stages 1, 2, and 3. As discussed above, control-signal memories 114 and 214 of Omega networks 100 and 200 each store twelve total control bits (i.e., 3 control signals×4 bits/control signal) for each interleaving mapping (i.e., particular routing of the eight inputs to the eight outputs). Control seed memory 414, on the other hand, only stores control seed value CS[0:3], which has a total of four bits. Thus, control-seed memory 414 stores eight fewer control bits than control-signal memories 114 and 214 for each different mapping. The savings in the number of control bits stored is greater for larger Omega networks. For example, as discussed above, the control-signal memory of a conventional (128×128) Omega network, analogous to Omega network 100, stores 448 bits. A (128×128) Omega network analogous to Omega network 400, on the other hand, stores only M/2=128/2=64 bits for each interleaving mapping.

The difference in the number of control bits stored is even greater for Omega networks that implement multiple different mappings. For example, as described above, a (128×128) Omega network, analogous to Omega Network 100, that performs 12 different interleaving mappings stores 5,376 control bits. A (128×128) Omega Network, analogous to Omega Network 400, on the other hand, stores only 12 control seeds× 64 bits/control seed=768 bits.

Local/Global Interleaving

Figure 5:
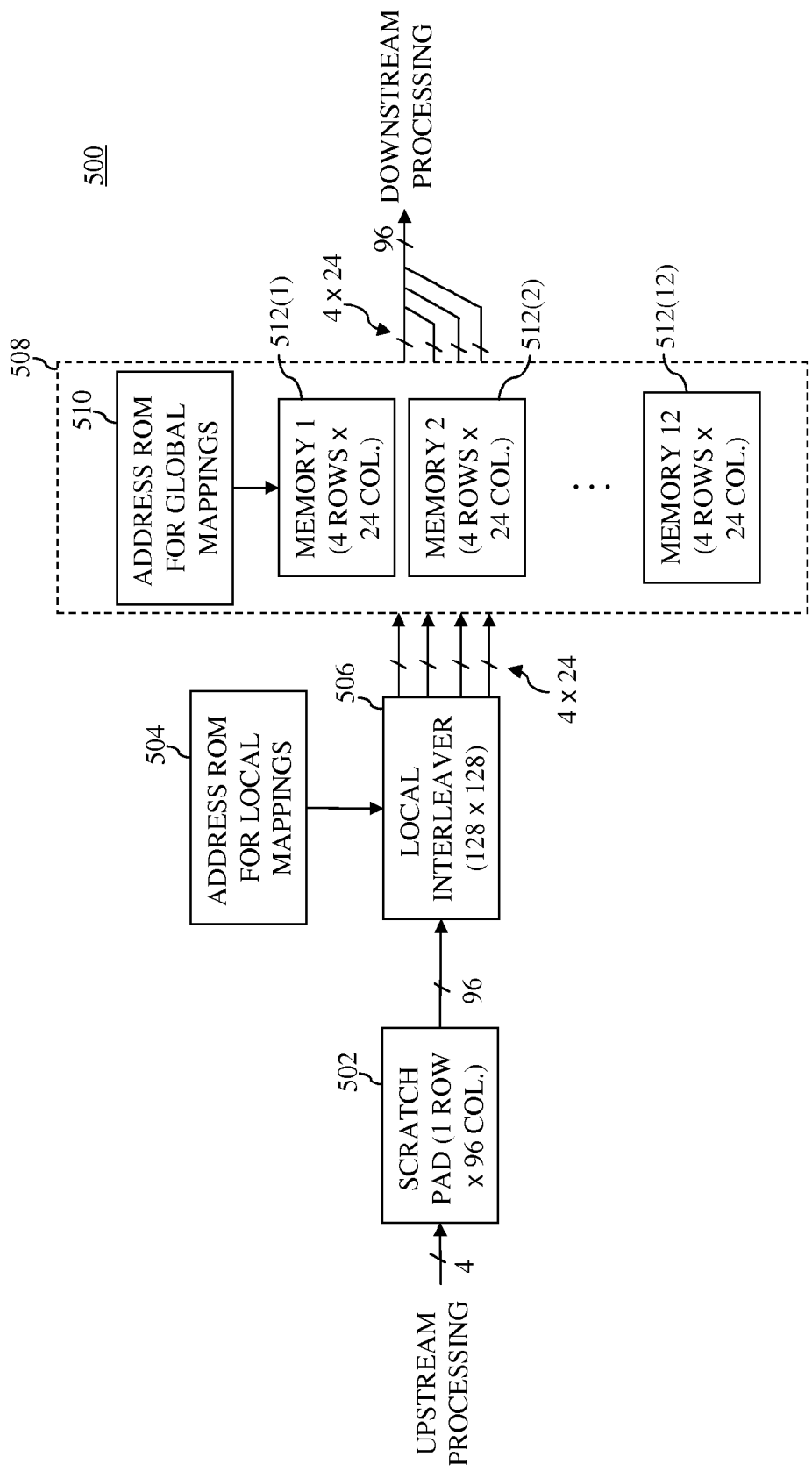
FIG. 5 shows a simplified block diagram of a local/global interleaver according to one embodiment of the present invention.

FIG. 5 shows a simplified block diagram of a local/global interleaver 500 according to one embodiment of the present invention. Local/global interleaver 500 has scratch pad memory 502, which accumulates sets of 96 input values, received at a rate of four input values at a time. Once 96 input values are accumulated, the set of 96 input values are provided to local interleaver 506.

Local interleaver interleaves the 96 input values in the set based on a local mapping provided by address ROM 504. The local mapping employed may vary from one interleaving operation to the next. Further, local interleaving 500 is performed on a local unit basis, where the local unit basis (i.e., the number of values treated as a fixed local unit for local de-interleaving) is one value. Thus, local interleaver 500 interleaves 96 local units (i.e., 96 values) at the level of the individual value (i.e., value by value) to generate a set of 96 interleaved input values. After interleaving each set of 96 input values, local interleaver 506 outputs four subsets of input values to global interleaver 508, where each subset has 24 input values, and begins receiving a new set of 96 input values.

Local interleaver 506 may be implemented as a (128×128) multistage interconnection network having $\log_2(128)=7$ configurable stages, each stage comprising 128/2=64 switches. Further, local interleaver 506 may be implemented using (i) fixed mappings analogous to those described above in relation to FIG. 2 and/or (ii) control-seed value permutating analogous to that described above in relation to FIG. 4. When implementing fixed mappings, local interleaver 506 may be configured to have 128−96=32 unused input terminals fixedly mapped to 32 unused output terminals. As a result, the remaining 96 used input terminals are configurably connected to the remaining 96 used output terminals. If control-seed value permutating is not used, the 96 used input terminals may be configurably connected to the remaining 96 used output terminals based on control signals provided by address ROM 504, where each control signal corresponds to a stage of local interleaver 506.

When implementing control-seed value permutating, address ROM 504 may store one control-seed value for each different interleaving mapping performed. To configure local interleaver 506 for an interleaving mapping, a control-seed value output by ROM 504 is permutated by seven cyclic shifters, each corresponding to a different one of the seven configurable stages, to generate a control signal for the corresponding configurable stage. Each of the seven configurable stages is then configured based on its corresponding control signal in a manner analogous to that described above in relation to FIG. 4.

Global interleaver 508 interleaves the subsets of 24 input values by storing each subset in memory banks 512(1) to 512(12). Global interleaving is performed at the level of the global unit (i.e., global unit by global unit), where each global unit is a subset of 24 interleaved values, to generate interleaved global units. Each memory bank 512 has four rows, where each row stores one subset of 24 input values. The particular row to which each subset is stored is selected based on addresses provided by address ROM 510. Each subset of 24 input values (i.e., each global unit) is stored in a different row of memory banks 512(1) to 512(12). The subsets of 24 input values may then be output in any order to downstream processing, which may be, as one example, a low-density parity-check decoder.

CONCLUSION

Although the present invention was described relative to its use with local/global interleavers and local/global de-interleavers, the present invention is not so limited. The present invention may be used to implement other interleavers and de-interleavers and may be used in applications other than interleaving and de-interleaving such in connecting multiple processors on one end of the network to multiple memory elements on the other end.

Further, although the invention has been described herein in the context of modified (8×8) Omega networks, the present invention is not so limited. The present invention may be implemented by modifying Omega networks other than (8×8) Omega networks. In fact, the present invention may be implemented for any Omega network size.

Additionally, the present invention may be applied to inverse Omega networks. An inverse Omega network reverses the processing of an Omega network. For example, looking at FIG. 4, an Omega network that is the inverse of Omega network 400 receives inputs values at terminals B[0] to B[7] and outputs the interleaved input values at terminals A[0] to A[7]. In such a case, the stage number i increases from a value of 1 at terminals B[0] to B[7] to a value of 3 at terminals A[0] to A[7]. Further, the cyclic-shift values Cyclic_Shift_i may be calculated as shown in Equation (2) as follows:

$$\text{Cyclic\_Shift}\_i = i \times \text{ceil}(N/(2 \times L)) + i \qquad (2)$$

For example, cyclic shifter 422 shifts the control-seed value by a value of 1×ceil(8/(2×3))+1=3, cyclic shifter 420 shifts the control seed by a value of 2×ceil(8/(2×3))+2=6, and cyclic shifter 418 shifts the control seed by a value of 3×ceil(8/(2×3))+3=9. Note that cyclic shifters 418, 420, and 422 generate the same cyclic-shift values (e.g., 9, 6, 3, respectively) regardless of whether they are implementing an Omega network or and inverse Omega network.

Various embodiments may be envisioned that employ multistage interconnection networks other than Omega networks. For example, Delta networks may be implemented having one or more unused input terminals, each of which is mapped using fixed connections to an unused output terminal, such that the mapping does not change. Further, Delta networks may be implemented having control-seed memories, wherein only one control seed value is stored for each interleaving mapping performed by each Delta network. The control seed value for a given interleaving mapping may then be permutated to generate the control signals for one or more stages of the Delta network.

According to various embodiments, control-seed memories and cyclic shifters analogous to those in FIG. 4 may be employed with multistage interconnection networks such as Omega network 100, in which all of the network input terminals may be mapped variously to the all of the network output terminals.

It will be further understood that various changes in the details, materials, and arrangements of the parts which have been described and illustrated in order to explain the nature of this invention may be made by those skilled in the art without departing from the scope of the invention as expressed in the following claims. For example, according to various embodiments, the present invention may be implemented using switch sizes other than (2×2), such as (4×4) or (z×z) where z is smaller than N. A discussion of Omega networks having (4×4) switch sizes may be found in Mahajan, et al., "Performance and Reliability Analysis of New Fault-Tolerant Advance Omega Network," WSEAS Transactions on Computers, Issue 8, Volume 7, August 2008, the teachings of which are incorporated herein by reference in their entirety. When implementing a multistage interconnection network with (4×4) switches, the unused input terminals and the unused output terminals may be selected in a manner analogous to that described in FIG. 3.

As another example, various embodiments of the present invention may implement permuters other than cyclic shifters 418, 420, and 422 to generate control signals C1[0:3], C2[0:3], and C3[0:3]. Such other permuters may perform permutations other than cyclic shifting. As yet another example, the number of fixed outputs and the locations of the fixed outputs may vary. As even yet another example, the cyclic shifters may be arranged in series, rather than in parallel, such that each cyclic shifter, after the first cyclic shifter, shifts the control bits of the previous stage. For example, cyclic shifter 420 may cyclically shift control bits C1[0:3] output by cyclic shifter 418 to generate control bits C2[0:3], and cyclic shifter 422 may cyclically shift control bits C2[0:3] output by cyclic shifter 420 to generate control bits C3[0:3].

As yet still another example, various embodiments of the present invention may be envisioned in which the control-seed value is used as a control signal for one or more stages of the multistage interconnection network. For example, in FIG. 4, control seed-value CS[0:3] may be used as a control signal for stage 1. Thus, control-seed value CS[0:3] may be applied directly to the switches of stage 1 without cyclic shifter 418 cyclically shifting control-seed value CS[0:3], and cyclic shifter 418 can be omitted.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The present invention can also be embodied in the form of program code, for example, stored in a non-transitory machine-readable storage medium including being loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

The present invention can also be embodied in the form of a bitstream or other sequence of signal values stored in a non-transitory recording medium generated using a method and/or an apparatus of the present invention.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An apparatus comprising a configurable (N×N) multistage interconnection network having N input terminals connected to N output terminals by a plurality of stages, each stage having a plurality of switches, wherein the multistage interconnection network comprises a plurality of fixed switches and a plurality of configurable switches, such that:
   J of the N input terminals are fixedly connected to J of the N output terminals through the plurality of fixed switches; and
   the remaining (N−J) input terminals are configurably connectable to the remaining (N−J) output terminals by configuring the plurality of configurable switches such that the remaining (N−J) input terminals are not routed to the J output terminals.

2. The apparatus of claim 1, wherein each of the remaining (N−J) input terminals can be configured to route a different one of (N−J) input values to a different one of the remaining (N−J) output terminals.

3. The apparatus of claim 1, wherein:
   the plurality of configurable switches are configured based on at least one control signal, each control signal corresponding to a stage of the multistage interconnection network; and
   the multistage interconnection network further comprises a logical gate corresponding to each fixed switch, wherein each of the fixed switches is fixed by:
      applying, to generate a fixed output, (i) a bit of the at least one control signal to a first input of the logical gate and (ii) a fixed value to a second input of the logical gate; and
      configuring the fixed switch based on a value of the fixed output.

4. The apparatus of claim 3, wherein:
   the logical gate is a logical AND gate; and
   the fixed value is set to a value of zero to generate a fixed output having a value of zero.

5. The apparatus of claim 1, wherein the multistage interconnection network is an Omega network.

6. The apparatus of claim 1, further comprising:
memory adapted to store multiple sets of control signals, each set corresponding to a different mapping from the remaining (N–J) input terminals to the remaining (N–J) output terminals; and
a controller adapted to sequentially select different sets of control signals to achieve different mappings.

7. The apparatus of claim 1, further comprising:
memory adapted to store a control-seed value; and
one or more permuters adapted to permutate the control-seed value to generate one or more control signals, wherein:
    each control signal corresponds to a different stage of the multistage interconnection network; and
    the plurality of configurable switches are configured based on the one or more control signals.

8. The apparatus of claim 7, wherein:
the memory is adapted to store two or more different control-seed values, each corresponding to a different mapping from the remaining (N–J) input terminals to the remaining (N–J) output terminals; and
the multistage interconnection network comprises a controller adapted to sequentially select different control-seed values to permutate to achieve different mappings.

9. The apparatus of claim 1, wherein the apparatus is an integrated circuit.

10. The apparatus of claim 1, wherein the multistage interconnection network implements a local interleaver in a local/global interleaver.

11. A method for making a configurable (N×N) multistage interconnection network having N input terminals connected to N output terminals by a plurality of stages, each stage having a plurality of switches, the method comprising:
(a) selecting J of the N input terminals to be unused input terminals; and
(b) fixing a subset of the plurality of switches to fixedly connect the J unused input terminals to J unused output terminals, such that:
the plurality of switches comprises the subset of fixed switches and a subset of configurable switches; and
the remaining (N–J) input terminals are configurably connectable to the remaining (N–J) output terminals by configuring the subset of configurable switches such that the remaining (N–J) input terminals are not routed to the J output terminals.

12. The method of claim 11, wherein the multistage interconnection network is an Omega network.

13. A method for operating a configurable (N×N) multistage interconnection network having N input terminals connected to N output terminals by a plurality of stages, each stage having a plurality of switches, wherein the multistage interconnection network comprises a plurality of fixed switches and a plurality of configurable switches, such that:
J of the N input terminals are fixedly connected to J of the N output terminals through the plurality of fixed switches; and
the remaining (N–J) input terminals are configurably connectable to the remaining (N–J) output terminals by configuring the plurality of configurable switches, the method comprising:
(a) configuring the plurality of configurable switches to connect the remaining (N–J) input terminals to the remaining (N–J) output terminals; and
(b) routing (N–J) input values applied to the remaining (N–J) input terminals to the remaining (N–J) output terminals such that the remaining (N–J) input terminals are not routed to the J output terminals.

14. The method of claim 13, further comprising:
(c) changing the configuration of the plurality of configurable switches; and
(d) routing subsequent input values applied to the (N–J) input terminals to the (N–J) output terminals.

15. The method of claim 13, wherein:
in step (a), the plurality of configurable switches are configured based on at least one control signal, each control signal corresponding to a stage of the multistage interconnection network; and
each of the plurality of fixed switches are fixed by:
    applying, to generate a fixed output, (i) a bit of the at least one control signal to a first input of a logical gate and (ii) a fixed value to a second input of the logical gate; and
    configuring the fixed switch based on a value of the fixed output.

16. The method of claim 15, wherein:
the logical gate is a logical AND gate; and
the fixed value is set to a value of zero to generate a fixed output having a value of zero.

17. The method of claim 13, wherein the multistage interconnection network is an Omega network.

18. The method of claim 13, further comprising:
storing multiple sets of control signals, each set corresponding to a different mapping from the (N–J) input terminals to the (N–J) output terminals; and
sequentially selecting different sets of control signals to achieve different mappings.

19. The method of claim 13, further comprising:
storing a control-seed value; and
permutating the control-seed value to generate one or more control signals, wherein:
    each control signal corresponds to a different stage of the multistage interconnection network; and
    the plurality of configurable switches are configured based on the one or more control signals.

20. The method of claim 19, further comprising:
storing one or more additional control-seed values, each corresponding to a different mapping from the (N–J) input terminals to the (N–J) output terminals; and
sequentially selecting different control-seed values to permutate to achieve different mappings.

\* \* \* \* \*